(12) United States Patent
Dory et al.

(10) Patent No.: US 9,184,719 B2
(45) Date of Patent: Nov. 10, 2015

(54) IDENTIFYING A CHANGE TO ADJUST AUDIO DATA

(75) Inventors: Jon R Dory, Fort Collins, CO (US); Robert F Yockey, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 629 days.

(21) Appl. No.: 13/563,617

(22) Filed: Jul. 31, 2012

(65) Prior Publication Data

US 2014/0037103 A1 Feb. 6, 2014

(51) Int. Cl.
*H03G 5/00* (2006.01)

(52) U.S. Cl.
CPC ..................... *H03G 5/005* (2013.01)

(58) Field of Classification Search
CPC ...................................... H03G 5/005
See application file for complete search history.

(56) References Cited

U.S. PATENT DOCUMENTS

| 5,673,363 | A  | * | 9/1997  | Jeon et al. ............... 704/270 |
| 6,597,961 | B1 | * | 7/2003  | Cooke .......................... 700/94 |
| 8,046,214 | B2 | * | 10/2011 | Mehrotra et al. ......... 704/200.1 |
| 8,155,335 | B2 |   | 4/2012  | Rutschman |
| 2008/0226094 | A1 | * | 9/2008 | Rutschman ................. 381/79 |
| 2008/0254753 | A1 |   | 10/2008 | Steenstra et al. |
| 2010/0245585 | A1 |   | 9/2010  | Fisher et al. |
| 2012/0052810 | A1 |   | 3/2012  | Schreuder et al. |
| 2012/0083910 | A1 | * | 4/2012  | Lloyd et al. ................... 700/94 |

FOREIGN PATENT DOCUMENTS

KR 20090060982 6/2009

OTHER PUBLICATIONS

Libratone Live Airplay Speakers—Standard Black, retreived from the web, Jul. 31, 2012. http://www.techbuy.com.au/p/189917/TABLETPC_IPAD_3_ACCESSORIES/Libratone/LIB001R.asp, 4 pgs.

* cited by examiner

*Primary Examiner* — David Bilodeau
(74) *Attorney, Agent, or Firm* — HP Legal Department

(57) ABSTRACT

Examples disclose a method of transmitting audio data to a wireless device and receiving frequency coefficients associated with the audio data from the device. Further, examples disclose analyzing the frequency coefficients to identify a change between the transmitted audio data and the received frequency coefficients. Additionally, examples also disclose adjusting a second audio data based on the identified change.

15 Claims, 5 Drawing Sheets

IDENTIFYING A CHANGE TO ADJUST AUDIO DATA

BACKGROUND

Audio music users increasingly rely on their wireless devices in networks to listen to music. The audio music files have a broad frequency scope to include the sounds of the music and as such may take a large amount of bandwidth while the wireless networks are limited in bandwidth. This creates a loss of fidelity of the music file, resulting in a poor listening experience for a user.

BRIEF DESCRIPTION OF THE DRAWINGS

In the accompanying drawings, like numerals refer to like components or blocks. The following detailed description references the drawings, wherein.

DETAILED DESCRIPTION

Figure 1:
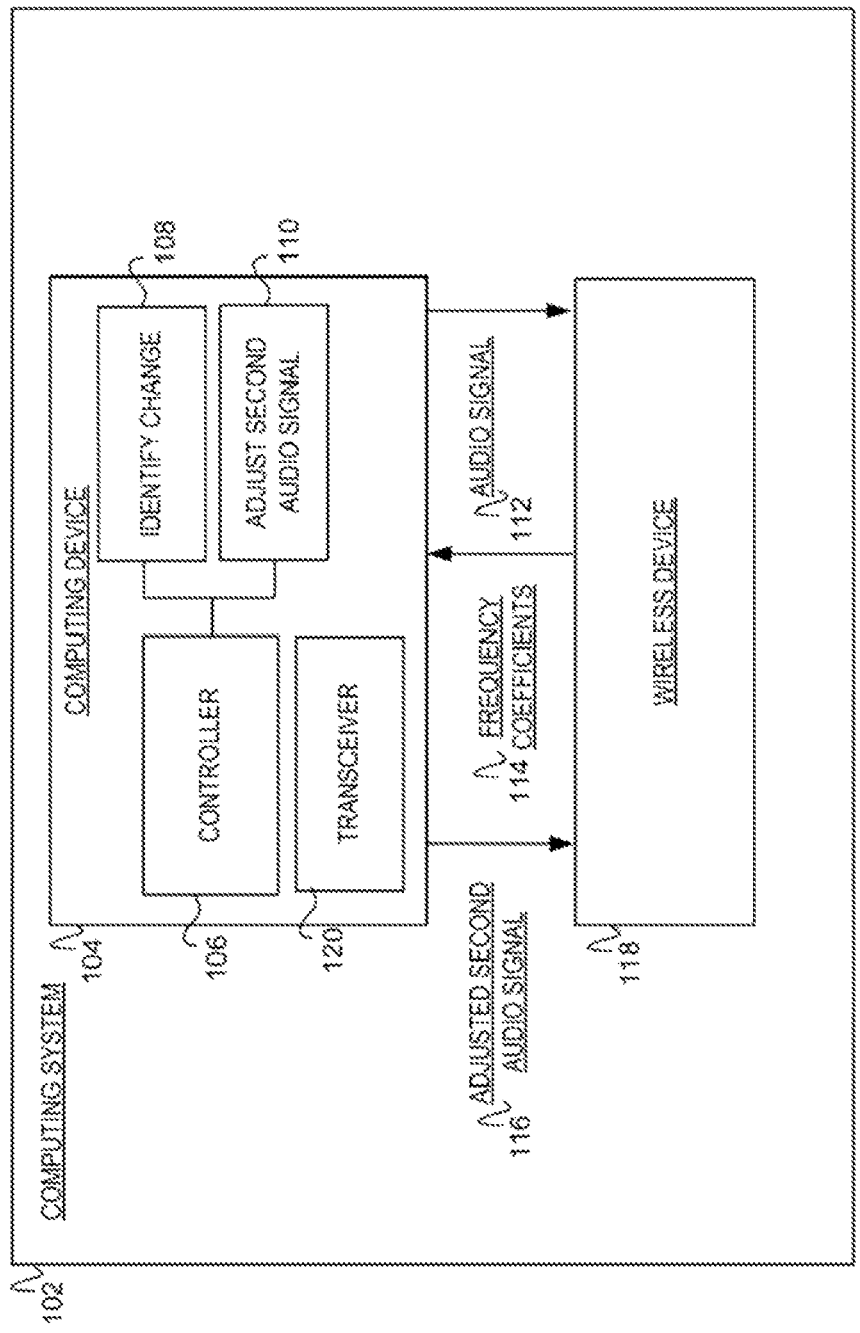
FIG. 1 is a block diagram of an example computing system including a computing device with a controller and a transceiver to transmit an audio signal and receive frequency coefficients from a wireless device to identify a change and adjust a second audio signal.

Transmitting audio music files across a wireless network may cause issues with the fidelity of the music as the bandwidth within the network is limited. In order to use the bandwidth efficiently, one solution is to compress the audio signals (i.e., audio data) prior to transmission in the wireless network. Compressing the audio signal enables the music file to be transmitted in a smaller amount of bandwidth. For example, the music file may be compressed from a mobile device prior to transmission to headphones and/or speakers. However, this creates a distortion of the audio file as the compression and transmission results in the loss of accuracy and exactness of the music file. Further this distortion leads to a loss of quality of the sound creating a poor listening experience for the user. Additionally, this compression may be optimized for voice data as the voices may contain less varying frequencies than music data, which results in additional distortion and loss.

In another solution, audio signals are compensated after transmission and arriving on the device. In this solution, incoming audio signals that may be lost during wireless transmission are compensated once received on the device. However, this solution may not fully compensate the audio signals to fully recover the lost data. For example, it may be difficult to predict the lost data during transmission. This results in distortion as the audio signals are not accurately compensated for the loss.

To address these issues, example embodiments disclosed herein provide a method to transmit audio data to a wireless device and receive frequency coefficients which are associated with the audio data to identify a change between the transmitted audio data and the received frequency coefficients. Identifying the change, enables a second audio data to adjust for future compensation loss. Adjusting the second audio data, provides a better listening experience for the user as the losses are compensated prior to transmission to the wireless device. Further this embodiment enhances the sound quality for the user.

Further, receiving the frequency coefficients corresponding to the audio data enables a reconstruction of the audio data to identify these changes. Reconstructing the received audio data, the difference between the received audio data and the transmitted audio data may be readily identified to efficiently adjust other audio data based on this difference.

In another embodiment, example embodiments disclose decompressing the audio data at the wireless devices and inversely transforming to obtain the frequency coefficients. This enables the processing of the audio data to occur at the wireless device to obtain the coefficients for identifying the change. Additionally, this allows the wireless device to include headphones and/or speaker as being physically separated from the wireless device. Physically separating the headphones and/or speaker from the wireless device enables a digital signal processing module to be located within the headphones and/or speaker rather than on the separated wireless device.

In a further embodiment, example embodiments disclose interpolating the frequency coefficients. In this embodiment, utilizing interpolation enables the frequency coefficients (i.e., known data points) to construct a received audio stream (i.e., new data points) based on the coefficients. The received audio signal is different from the transmitted audio signal as the received audio signal is assumed to be with losses, such as transmission and/or compression losses. This enables a quick and efficient identification of the change since the received audio signal may be in a similar structure to the transmitted audio signal.

Yet, in a further embodiment, example embodiments disclose transmitting the adjusted second audio data. In this embodiment, once the second audio data is adjusted using the identified change, the adjusted second audio data is transmitted to the wireless device. This embodiment enables a seamless experience to the user for listening to quality music files. This further provides a better listening experience for the user as the audio data is adjusted and transmitted without any input or prompting by the user.

In summary, example embodiments provide a more satisfying music listening experience for a user by compensating for transmission and/or compression losses of audio music files over a wireless network. Compensating for these wireless losses, thus providing a higher quality audio to a wireless device.

Referring now to the drawings, FIG. 1 is a block diagram of an example computing system 102 including a computing device 104 with a controller 106 and a transceiver 120 to transmit an audio signal 112 to a wireless device 118 and receive frequency coefficients 114 corresponding to the audio signal 112. Additionally, the computing device 104 receives the frequency coefficients 114 to identify a change at module 108 and adjust a second audio signal at module 110. Further, the computing device 104 transmits the adjusted second audio signal 116 to the wireless device 118. Embodiments of the computing system 102 include a server, computing device, wireless network, local area network (LAN), wide area network (WAN), computing network, or any other computing system suitable to support the wireless device 118 and the computing device 104 including the controller 106 and the transceiver 120.

The computing device 104 includes the transceiver 120 to transmit the audio signal 112 to the wireless device 118 and receive the frequency coefficients 114 corresponding to the audio signal 112. The computing device 104 then adjusts the frequency coefficients 114 to compensate for the losses across the network. Such losses include transmission and/or compression losses. Additionally, the computing device 104 includes the controller 106 to process the frequency coefficients 114 to identify the change at module 108. The change represents the differences (i.e., transmission and/or compression losses) between the transmitted audio signal 112 and the received audio signal 112 by the wireless device 118. Further, the computing device 104 adjusts the second audio signal 110 for transmission 116. In this embodiment, the computing device 104 acts as a type of calibration device by using the change identified at module 108 to adjust other audio signals. In this regard, the audio signal 112 is a type of base measurement to determine the losses for audio signals across a wireless network. Embodiments of the computing device 104 include a server, computing source, client device, personal computer, desktop computer, laptop, a mobile device, or other computing device suitable to include components 106 and 120 and capable of transmitting audio signals 112 and 116 and receiving frequency coefficients 114.

The controller 106 identifies the change at module 108 and adjusts the second audio signal at module 110. In one embodiment, the controller 106 may retrieve the audio signal 112 from a storage area (not illustrated) for the transceiver 120 to transmit to the wireless device 118. Embodiments of the controller 106 include a microchip, chipset, electronic circuit, processor, microprocessor, semiconductor, microcontroller, central processing unit (CPU), graphics processing unit (GPU), visual processing unit (VPU), or other programmable device capable of identifying the change at module 108 to adjust the second audio signal at module 110.

The transceiver 120 is an electronic component as part of the computing device 104 which may both transmit audio signal 112 and 116 and receive frequency coefficients 114. In this embodiment, the transceiver 120 may include both a transmitter and receiver which may be combined to share common circuitry. In another embodiment, the transceiver 120 includes the transmitter and the receiver as separate components within the computing device 104. Embodiments of the transceiver 120 include a transponder, transverter, repeater, two-way radio, medium attachment unit, or other type of transceiver capable of transmitting audio signals 112 and 116 and receiving frequency coefficients 114.

The audio signal 112 (i.e., audio data) is a representation of sound from a source (i.e., the computing device 104) to the wireless device 118. In this embodiment, the audio signal 112 is considered as a previously known signal by the computing device 104 to enable the frequency coefficients 114 to be compared to the audio signal 112 to identify the change at module 208. The audio signal 112 is may include a song and/or music as it may be intended to sound as by an audio engineer (i.e., without losses). Embodiments of the audio signal 112 include audio data, audio packet, audio, song, music file, music stream, or other type of audio signal including sound for output on the wireless device 118. The audio signal 112 contains broad frequency responses as part of a song unlike single voice streams which has a narrow frequency response. Since music has considerable broad frequency variance, it takes up more bandwidth than a voice signal which has a tighter frequency channel. For example, the music file may include a bass beat which has a lower note frequency while a synthesized note has a higher note frequency, thus resulting in a more broad frequency.

The wireless device 118 receives the audio signal 112 from the computing device 104 and processes the audio signal 112 to obtain the frequency coefficients 114. In one embodiment, the wireless device 118 includes headphones and/or speaker to output music from the adjusted second audio signal 116. In another embodiment, the wireless device 118 includes a controller and/or a digital signal processing module. Placing a digital signal processing module on the wireless device 118, specifically with the output device (i.e., speakers, headphones, etc.), the computing system 102 may correct and compensate for future losses of audio. In a further embodiment, the wireless device 118 may inversely transform the audio signal 112 to obtain the frequency coefficients 114 to transmit to the computing device 104. These embodiments are described in detail in later figures. Embodiments of the wireless device 118 include a client device, personal computer, desktop computer, laptop, a mobile device, headset, headphones, earbuds, speakers, or other wireless device suitable receive the audio signal 112 and transmit the frequency coefficients 114.

The frequency coefficients 114 represent the frequencies of the audio signal 112 as received by the wireless device 118 (i.e., with transmission and/or compression losses). In this embodiment, the frequency coefficients 114 correspond to the audio signal 112 as these represent the varying frequencies of the audio signal 112 received from the computing device 104. For example, the audio signal 112 may include a song and as such, the frequency coefficients 114 represent the varying frequencies of the song from drum beats to synthesized notes as received by the wireless device 118. Further, in this embodiment, the frequency coefficients 114 correspond to what is received by the wireless device 118. For example, the audio signal 112 prior to transmission from the computing device 104 is without any transmission loses, while the wireless device 118 receives the audio signal 112 with transmission and/or compression losses. Using the frequency coefficients 114, the computing device 104 may track what losses the wireless device 118 receives and thus may compensate other audio signals for these losses. Embodiments of the frequency coefficients 114 include a character, value, term, symbol, factor, expression, variable, representation, or other coefficient representing the frequencies corresponding the audio signal 112 received by the wireless device 118.

The module 108 identifies the change from the frequency coefficients 114 and the audio signal 112 transmitted to the wireless device 118. Embodiments of the module 108 include a set of instructions, instruction, process, operation, logic, algorithm, technique, logical function, firmware, and or software executable by the computing device 104 to analyze the frequency coefficients 114 received from the wireless device 118 to identify the change. In another embodiment, module 108 may include interpolating the frequency coefficients 114 to generate an audio signal as received by the wireless device 118. In this embodiment, the computing device 104 may compare both the audio signal 112 transmitted to the wireless device 118 and the audio signal constructed from the frequency coefficients 114 to readily identify the change. This embodiment is described in detail in later figures.

The module 110 adjusts a second audio signal 110 based on the change identified at module 108. Embodiments of the module 110 include a set of instructions, instruction, process, operation, logic, algorithm, technique, logical function, firmware, and or software executable by the computing device 104 to adjust the second audio signal based on the identified change at module 108. The adjusted second audio signal 116 is transmitted from the computing device 104 to the wireless device 118 once the second audio signal is adjusted at module 110.

The adjusted second audio signal 116 is created at module 110 and includes the second audio signal with the change identified at module 108. As such, the second audio signal may be adjusted and/or over-compensated based on the change which represents the wireless losses over the network. In the embodiment, the wireless device 118 may receive compensated audio signals to prevent wireless loss and/or distortion. Embodiments of the adjusted audio signal include audio data, audio packet, song, music file, music stream, or other type of audio signal including sound for output on the wireless device 118.

Figure 2:
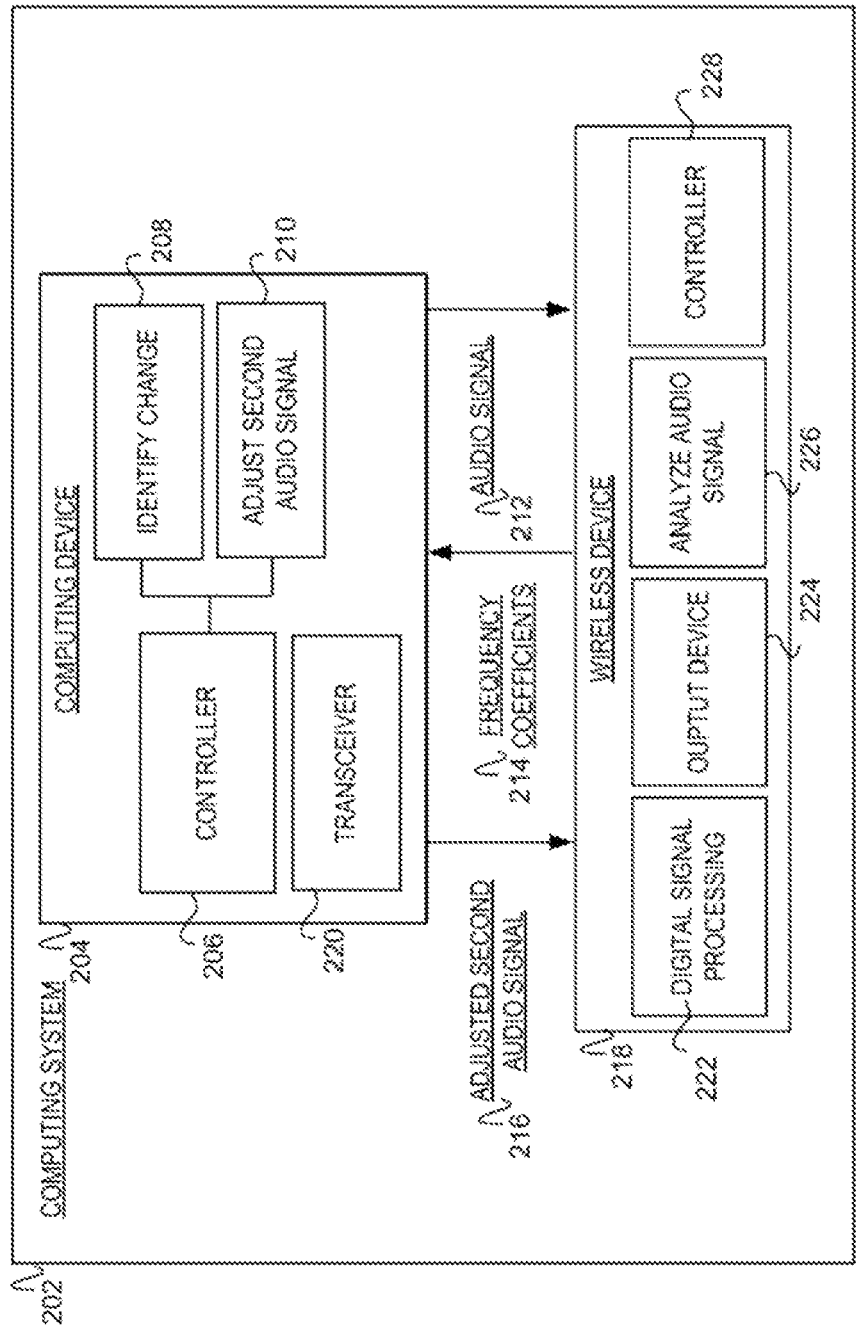
FIG. 2 is a block diagram of an example computing system including a computing device with a controller and transceiver and a wireless device with a controller to transmit an audio signal, receive frequency coefficients, identify a change, and transmit an adjusted second audio signal.

FIG. 2 is a block diagram of an example computing system 202 including a computing device 204 with a controller 206 and a transceiver 220, and further including a wireless device 218 with a digital signal processing module 222, output device 224, analyze module 226, and controller 228. The computing device 204 transmits an audio signal 212, adjusted second audio signal 216, and receives frequency coefficients 214 from the wireless device 218 to identify a change at module 208 and adjust a second audio signal at module 210. The computing system 202 and the computing device 204, may be similar in structure and functionality to the computing system 102 and the computing device 104 as in FIG. 1.

The controller 206 retrieves the audio signal 212 for transmission by the transceiver 220 to the wireless device 218. Additionally, the controller 206 and the transceiver 220 receive frequency coefficients 214 to identify the change at module 208 and adjusts the second audio signal at module 210. The controller 206 and the transceiver 220 may be similar in structure and functionality to the controller 106 and the transceiver 120 as in FIG. 1.

The audio signal 212 transmitted from the computing device 204 represents a song and/or music without wireless losses. The audio signal may be similar in structure and functionality to the audio signal 112 as in FIG. 1.

The frequency coefficients 214 are generated by the wireless device 218 as a way to track the wireless losses from the computing device 204 to the wireless device 218 (i.e., over the wireless network). The frequency coefficients 214 may be similar in structure and functionality to the frequency coefficients 112 as in FIG. 1.

The module 208 and the module 210 receive the frequency coefficients 214 to identify the change and adjust the second audio signal. The change identified at module 208 represents the difference between the audio signal 212 and the frequency coefficients 214. The audio signal 212 is assumed to be without distortion as the audio signal 212 as it is prior to transmission to the wireless device 218 and as such, without losses. The frequency coefficients 214 are assumed to have suffered distortion as these 214 correspond to the audio signal 212 after transmission to the wireless device 218. The module 208 and the module 210 may be similar in functionality to the modules 108 and 110 as in FIG. 1.

The wireless device 218 includes the controller 228 to receive the audio signal 212 for analysis at module 226 to obtain the frequency coefficients 214. Additionally, the wireless device 218 may process the digital signal aspect of the audio signal 212 for analysis and output the adjusted second audio signal 216 at modules 222-226. The wireless device 218 may be similar in structure and functionality to the wireless device 118 as in FIG. 1.

The controller 228 receives the audio signal 212 for analysis, output, and/or processing at modules 222-226. The controller 228 may be similar in structure to the controller 206 and as such, embodiments of the controller 228 include a microchip, chipset, electronic circuit, processor, microprocessor, semiconductor, microcontroller, central processing unit (CPU), graphics processing unit (GPU), visual processing unit (VPU), or other programmable device receiving the audio signal 212 for analysis, processing, and/or output at modules 222-226.

The module 226 analyzes the audio signal 212 received from the computing device 204 to obtain the frequency coefficients 214 corresponding to the audio signal 212. In one embodiment, the module 226 inversely transforms the received audio signal 212 to generate the frequency coefficients 214. In this embodiment, the wireless device 226 contains the set of instructions needed to analyze the audio signal 212 to send back data corresponding to the audio signal 212 for the computing device 204 to track and compensate for the losses. In another embodiment, the module 226 includes the digital signal processing module 222 for analysis. Embodiments of the module 226 include a set of instructions, instruction, process, operation, logic, algorithm, technique, logical function, firmware, and or software executable by the wireless device 218 to analyze the audio signal 212.

The output device 224 outputs the adjusted second audio signal 216 and/or the audio signal 212 for playback on the wireless device 218. The output device 224 includes an electrical device to produce sound in response to the audio signal 212 input and/or audio signal 212. In another embodiment, the output device 224 is physically separated from the wireless device 218. For example, the wireless device 218 may include a mobile phone, while the output device 224 may include a wireless headset separated from the mobile phone. Embodiments of the output device 224 include a speaker, headphones, headset, earbuds, earphones, stereo, transducer, electroacoustic transducer, or other device capable of producing sound in response to the adjusted second audio signal 216.

The module 222 processes the digital signal aspect of the audio signal 212 for analysis. The digital signal processing module 222 manipulates data within the audio signal 212 to modify and/or improve to generate the frequency coefficients 214 and/or for playback. In one embodiment, module 222 filters the audio signal 212 to remove noise. Embodiments of module 222 include a set of instructions, instruction, process, operation, logic, algorithm, technique, logical function, firmware, and or software executable by the wireless device 218 to process the digital aspect of the audio signal 212.

The adjusted second audio signal 216 is compensated with the change as identified at module 208 prior to transmission to the wireless device 218 to account for wireless losses. The adjusted second audio signal 216 may be similar in structure and functionality to the adjusted second audio signal 116 as in FIG. 1.

Figure 3:
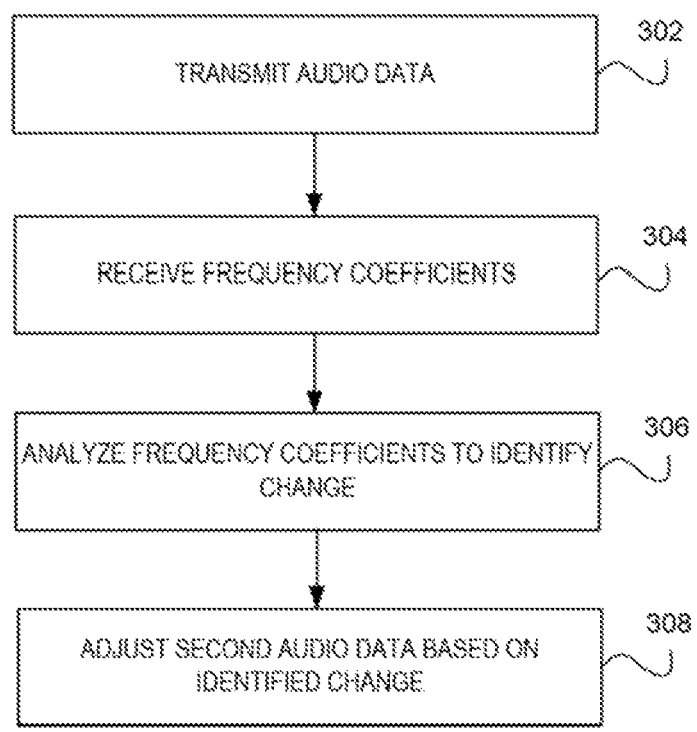
FIG. 3 is a flowchart of an example method performed on a computing device to transmit audio data, receive frequency coefficients to analyze for identification of a change; and adjust a second audio data based on the identified change.

FIG. 3 is a flowchart of an example method performed on a computing device to transmit audio data, receive frequency coefficients for analysis to identify a change, and adjust a second audio data based on the identified change. Although FIG. 3 is described as being performed on computing device 104 and 204 as in FIG. 1 and FIG. 2, it may also be executed on other suitable components as will be apparent to those skilled in the art. For example, FIG. 3 may be implemented in the form of executable instructions stored on a machine-readable storage medium or on a wireless device 118 and 218 as in FIG. 1 and FIG. 2 or in the form of electronic circuitry.

At operation 302 the computing device transmits audio data to the wireless device. In an embodiment, the computing device compresses the audio data prior to transmission. In another embodiment, operation 302 transmits audio signals which may include a music file. In a further embodiment, the computing device retrieves the audio data from a memory to transmit to the wireless device.

At operation 304 the computing device receives frequency coefficients from the wireless device corresponding to the audio data transmitted at operation 302. In an embodiment, the wireless device decompresses the audio data transmitted at operation 302. In this embodiment, the wireless device analyzes the audio data to obtain the frequency coefficients for transmission to the computing device at operation 306.

At operation 306 the computing device analyzes the frequency coefficients associated with the audio data to identify a change. The change is a difference between the audio data at operation 302 and the frequency coefficients received at operation 304. In an embodiment, operation 306 includes performing interpolation of the frequency coefficients to reconstruct a received audio data. In this embodiment, the computing device may readily identify the change since the received audio data may be reconstructed into a similar structure to the audio data transmitted at operation 302.

At operation 308 the computing device adjusts a second audio data based on the change identified at operation 306. In one embodiment, the adjusted second audio data is transmitted to the wireless device. In this embodiment, the audio data is compensated for the losses as predicted from change identified at operation 306.

Figure 4:
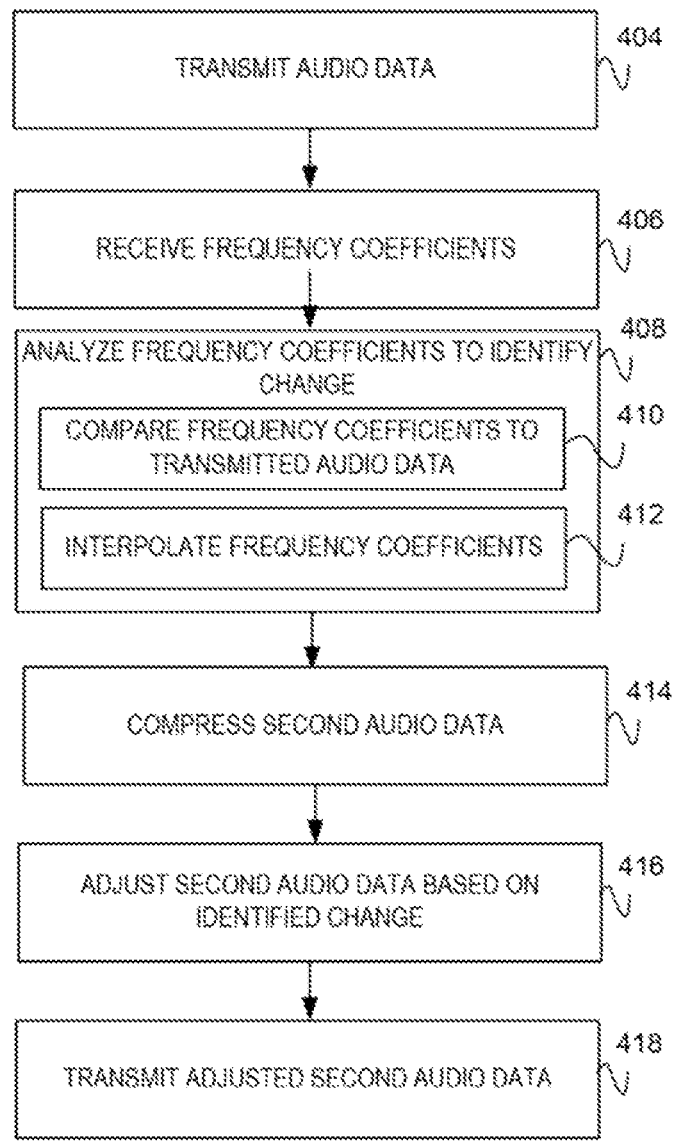
FIG. 4 is a flowchart of an example method performed on a computing device to receive frequency coefficients, analyze the frequency coefficients to identify a change including comparing the coefficients and interpolating, compress a second audio data, and adjust the second audio data based on the identified change for transmission.

FIG. 4 is a flowchart of an example method performed on a computing device to transmit audio data, receive frequency coefficients, analyze the frequency coefficients to identify a change including comparing the coefficients and interpolating, compress a second audio data, and adjust the second audio data based on the identified change for transmission. Although FIG. 4 is described as being performed on computing device 104 and 204 as in FIG. 1 and FIG. 2, it may also be executed on other suitable components as will be apparent to those skilled in the art. For example, FIG. 4 may be implemented in the form of executable instructions stored on a machine-readable storage medium or on a wireless device 118 and 218 as in FIG. 1 and FIG. 2 or in the form of electronic circuitry.

At operation 404 the computing device transmits the audio data to the wireless device. In an embodiment, operation 404 includes the wireless device receiving the audio data. In these embodiments, the received audio data unlike the transmitted audio data, is assumed to be lossy (i.e., with transmission and/or compression losses) as the audio data is transmitted over a wireless network. In another embodiment, the wireless device includes a wireless headset and/or speaker. In this embodiment, a digital signal processing module is located within the device to filter and/or modify the audio data to remove noise and/or to filter frequencies that may be too high or too low. In a further embodiment of operation 404, the wireless device decompresses the audio data. Yet, in a further embodiment of operation 404, the wireless device inversely transforms the audio data to obtain the frequency coefficients received by the computing device at operation 406. In this embodiment, wireless device utilizes a mathematical operation and/or manipulation, such as Laplace transforms, Fourier transforms, or Fast Fourier transforms (FFT) to obtain the frequency coefficients.

At operation 406 the computing device receives frequency coefficients from the wireless device for analysis at operation 408. The frequency coefficients are associated with the audio data transmitted at operation 404. The frequency coefficients correspond with the audio data received by that wireless device that represents the highs and lows of the various sounds of the received audio data. The computing devices utilizes the frequency coefficients of the received audio data to determine where and how the losses occurred prior to the transmission of the audio data.

At operation 408 the computing device analyzes the frequency coefficients received at operation 406 to identify a change. The change is the difference between the audio data transmitted at operation 404 and the received audio data that may be reconstructed using the frequency coefficients. In this embodiment, by identifying the change, the computing device may regenerate the audio data received by wireless device to account and adjust for those frequencies which may have been attenuated and/or lost in the wireless transmission from the computing device to the wireless device. In this regard, the computing device may reverse engineer using the frequency coefficients to identify the wireless losses. In another embodiment of operation 408, the frequency coefficients may be interpolated and/or compared to the transmitted audio data at operations 410 and 412 to identify the change. Additionally, these embodiments enable the computing device to adjust other audio data using the change (i.e., difference) to account for the losses prior to transmission. Thus when the audio data arrives at the wireless device, the audio data will have a better quality sound for the user.

At operation 410 the computing device compares the frequency coefficients received at operation 406 to the transmitted audio data at operation 404 to identify the change. In this embodiment, the change represents the loss of the audio data transmitted at step 404 across a wireless network.

At operation 412 the computing device interpolates the frequency coefficients received at operation 406 to identify the change. In this embodiment, the frequency coefficients are known data points as determined by the wireless device at operation 404. The computing device uses these known data points (i.e., range) to construct new data points. Additionally in this embodiment, by constructing new data points based on the known data points the computing device reconstructs the audio data as received by the wireless device. The received audio data is different from the transmitted audio data as the received audio data is assumed to be with losses. Using both the transmitted and the received audio data, the computing device may identify the change between the audio data.

At operation 414 the computing device compresses the second audio data prior to the adjustment at operation 418 and transmission to a wireless device at operation 418. In one embodiment of operation 414, while analyzing the frequency coefficients at operation 408 while in another embodiment, the computing device compresses the second audio data prior to the adjusting of the second audio data at operation 416. Compressing the audio data prior to transmission uses less bandwidth for transmission, rather than transmitting an uncompressed audio data. In another embodiment, the computing device retrieves the audio data from a storage area.

At operation 416 the computing device adjusts a second audio data with the changed identified at operations 408-412. In this embodiment, the second audio data may be adjusted to provide a higher quality audio to the wireless device. In another embodiment, operation 416 transmits the adjusted second audio data which was compressed at operation 414. In a further embodiment, operation 416 includes compressing the second audio data after adjusting the second audio data.

At operation 418 the computing device transmits the second audio data adjusted at operation 416 to the wireless device. In another embodiment, operation 418 outputs the adjusted second audio data on the wireless device for listening. In this embodiment, the second audio data is adjusted to account for the wireless losses enabling a higher quality audio data to be played on speakers and/or headset associated with the wireless device.

Figure 5:
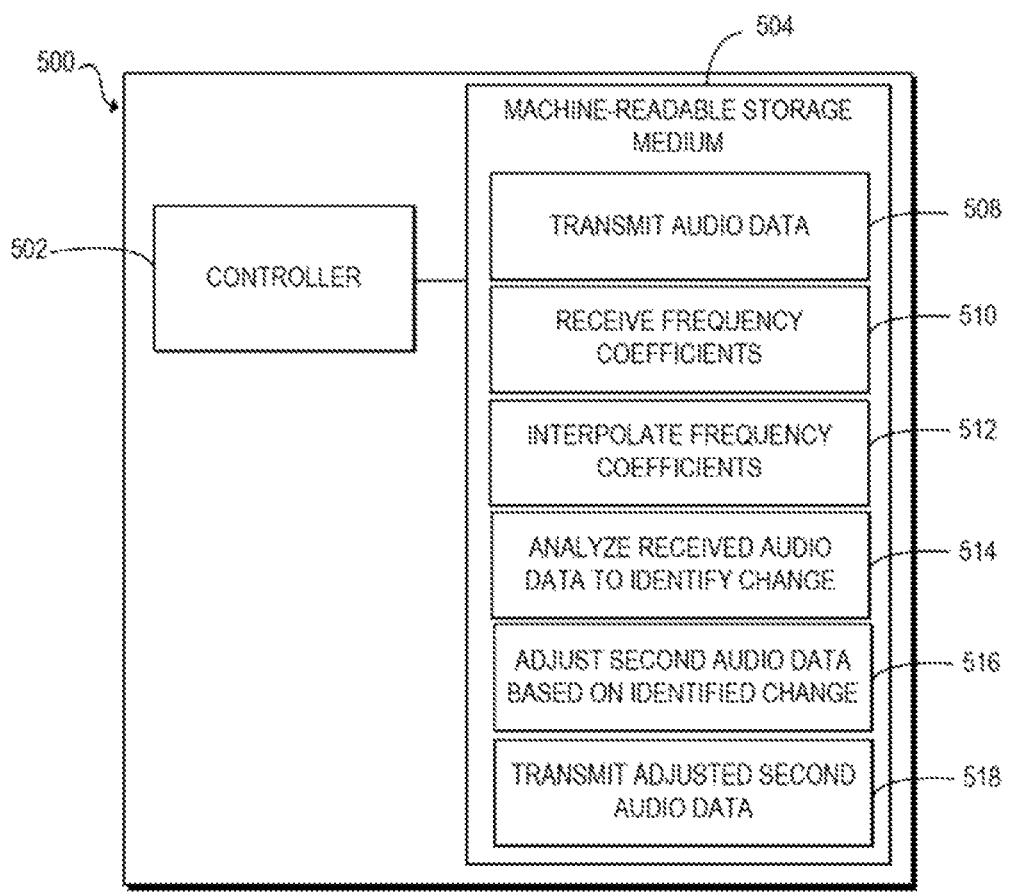
FIG. 5 is a block diagram of a computing device to transmit audio data, to receive frequency coefficients for analysis, compress a second audio data for transmission, and adjusting the second audio data based on the analysis for transmission.

Referring now to FIG. 5, a block diagram of an example computing device 500 for transmitting audio data to identify a change over a wireless network and adjusting a second audio data based on the identified change. Although the computing device 500 includes controller 502 and machine-readable storage medium 504, it may also include other components that would be suitable to one skilled in the art. For example, the computing device 502 may include a transceiver 120 and 220 as in FIG. 1 and FIG. 2. Additionally, the computing device 500 includes the functionality of the computing devices 104 and 204 as set forth above in FIG. 1 and FIG. 2.

The controller 502 may fetch, decode, and execute instructions 508, 510, 512, 514, 516, and 518. Embodiments of the controller 502 include a microchip, chipset, electronic circuit, microprocessor, semiconductor, processor, microcontroller, central processing unit (CPU), graphics processing unit (GPU), visual processing unit (VPU), or other programmable device capable of executing instructions 508-518. The controller 502 executes instructions to: transmit the audio data instructions 508; receive frequency coefficients corresponding to the audio data from a wireless device instructions 510; interpolate the frequency coefficients to construct received audio data from the wireless device instructions 512; analyze the constructed received audio data to identify a change between the transmitted audio data and the received audio data instructions 514; adjust a second audio data based on the identified change to compensate for losses to the wireless device instructions 516; and transmit the adjusted second audio data instructions 518.

The machine-readable storage medium 504 may include instructions 506-518 for the controller 502 to fetch, decode, and execute. The machine-readable storage medium 504 may be an electronic, magnetic, optical, memory, flash-drive, or other physical device that contains or stores executable instructions. Thus, the machine-readable storage medium 504 may include for example, Random Access Memory (RAM), an Electrically Erasable Programmable Read-Only memory (EEPROM), a storage drive, a memory cache, network storage, a Compact Disc Read Only Memory (CD-ROM) and the like. As such, the machine-readable storage medium 504 can include an application and/or firmware which can be utilized independently and/or in conjunction with the controller 502 to fetch, decode, and/or execute instructions on the machine-readable storage medium 504. The application and/or firmware can be stored on the machine-readable storage medium 504 and/or stored on another location of the computing device 500.

In summary, example embodiments provide a more satisfying music listening experience for a user by compensating for the losses of audio music files over a wireless network. Compensating for the wireless losses, provides higher quality audio to a wireless device.

We claim:

1. A method executed by a computing device comprising:
transmitting audio data to a wireless device;
receiving frequency coefficients associated with the audio data from the wireless device;
analyzing the frequency coefficients associated with the audio data to identify a change between the transmitted audio data and the received frequency coefficients; and
adjusting a second audio data based on the identified change.

2. The method of claim 1 further comprising:
compressing the audio data to transmit to the wireless device.

3. The method of claim 1 wherein the audio data is decompressed at the wireless device and inversely transformed to obtain the frequency coefficients.

4. The method of claim 1 wherein the analyzing the frequency coefficients associated with the audio data to identify the change between the transmitted audio data and the received frequency coefficients is further comprising:
interpolating the frequency coefficients to identify the change.

5. The method of claim 1 further comprising:
transmitting the adjusted second audio data to the wireless device to compensate for wireless transmission losses.

6. The method of claim 5 wherein the wireless device includes at least one of: a headset, a speaker, headphones, and earphones to output an audio of the adjusted second audio data.

7. The method of claim 1 wherein the analyzing the frequency coefficients associated with the audio data to identify the change between the transmitted audio data and the received frequency coefficients is further comprising:
comparing the frequency coefficients to the transmitted audio data to identify the change, the change represents a transmission loss from the transmitted audio data to the wireless device.

8. A non-transitory machine-readable storage medium encoded with instructions executable by a controller of a computing device, the non-transitory machine-readable storage medium comprising the instructions to:
transmit first audio data to a wireless device;
receive frequency coefficients associated with the first audio data from the wireless device;
interpolate the frequency coefficients to construct second audio data;
analyze the second audio data to identify a change between the first audio data and the second audio data;
adjust a third audio data based on the identified change; and
transmit the third audio data that is adjusted to the wireless device to compensate for wireless transmission losses.

9. The non-transitory machine-readable storage medium of claim 8 further comprising instructions to:
compress the first audio data to transmit to the wireless device; and wherein the first audio data is decompressed and inversely transformed at the wireless device to obtain the frequency coefficients.

10. The non-transitory machine-readable storage medium of claim 8 further comprising instructions to:
store the first audio data prior to transmission for analysis between the second audio data and the first audio data to identify the change.

11. The non-transitory machine-readable storage medium of claim 8 wherein the first audio data includes music.

12. A computing system to compensate for wireless transmission losses, the computing system comprising:
a computing device comprising a transceiver and a controller, the transceiver of the computing device to:
transmit a first audio signal to a wireless device;
receive frequency coefficients corresponding to the first audio signal; and transmit a second audio signal that is adjusted to the wireless device;
the controller of the computing device to:
   identify a change between the frequency coefficients and the first audio signal; and
   adjust the second audio signal based on the change.

13. The computing system further of claim 12 comprising:
the wireless device, wherein the wireless device comprises a controller to:
   analyze the first audio signal to obtain the frequency coefficients corresponding to the first audio signal; and
   output the second audio signal that is adjusted.

14. The computing system of claim 12, wherein the controller of the wireless device is further to analyze the first audio signal by inversely transforming the first audio signal to obtain the frequency coefficients; and
   wherein the controller of the computing device is further to identify the change by interpolating the frequency coefficients.

15. The computing system of claim 12, wherein the controller of the wireless device further comprises:
   a digital signal processing module to analyze the first audio signal.

* * * * *

UNITED STATES PATENT AND TRADEMARK OFFICE
CERTIFICATE OF CORRECTION

PATENT NO.        : 9,184,719 B2
APPLICATION NO.   : 13/563617
DATED             : November 10, 2015
INVENTOR(S)       : Jon R. Dory et al.

Page 1 of 1

It is certified that error appears in the above-identified patent and that said Letters Patent is hereby corrected as shown below:

In The Claims

In column 11, line 7, in Claim 13, delete "system further of" and insert -- system of --, therefor.

Signed and Sealed this
Fifth Day of April, 2016

Michelle K. Lee
*Director of the United States Patent and Trademark Office*